(12) United States Patent
Hara

(10) Patent No.: US 7,560,389 B2
(45) Date of Patent: Jul. 14, 2009

(54) METHOD FOR FABRICATING SEMICONDUCTOR ELEMENT

(75) Inventor: Kousuke Hara, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 206 days.

(21) Appl. No.: 11/429,216

(22) Filed: May 8, 2006

(65) Prior Publication Data
US 2006/0292878 A1 Dec. 28, 2006

(30) Foreign Application Priority Data
Jun. 28, 2005 (JP) .............................. 2005-188521

(51) Int. Cl.
*H01L 21/76* (2006.01)

(52) U.S. Cl. .................. 438/706; 438/404; 438/405; 438/410; 438/439; 438/442; 438/443; 438/694; 438/695; 438/735; 438/736; 438/744; 257/647; 257/E21.245; 257/E21.545; 257/E21.55; 257/E21.552

(58) Field of Classification Search ............... 438/694, 438/297, 362, 401, 404, 405, 410, 439, 442, 438/443, 452, 479, 481, 695, 697, 699, 700, 438/704–706, 749; 257/647, E21.245, E21.545, 257/E21.55, E21.552
See application file for complete search history.

(56) References Cited

U.S. PATENT DOCUMENTS

| | | | | |
|---|---|---|---|---|
| 5,259,922 A * | 11/1993 | Yamano et al. | ............. | 438/720 |
| 5,741,737 A * | 4/1998 | Kachelmeier | ............... | 438/286 |
| 5,780,352 A * | 7/1998 | Park et al. | .................... | 438/404 |
| 5,863,827 A * | 1/1999 | Joyner | ........................ | 438/425 |
| 6,033,991 A * | 3/2000 | Ramkumar et al. | ......... | 438/713 |
| 6,303,413 B1 * | 10/2001 | Kalnitsky et al. | ........... | 438/151 |
| 6,495,431 B2 * | 12/2002 | Matsuzaki | .................. | 438/439 |
| 6,524,929 B1 * | 2/2003 | Xiang et al. | ................ | 438/424 |
| 6,720,233 B2 * | 4/2004 | Muth | .......................... | 438/404 |
| 7,338,881 B2 * | 3/2008 | Sakata et al. | ................ | 438/442 |
| 2002/0155698 A1 * | 10/2002 | Lyer et al. | ................... | 438/636 |
| 2003/0104661 A1 * | 6/2003 | Koyama | ..................... | 438/164 |
| 2004/0124490 A1 * | 7/2004 | Bohr et al. | .................. | 257/506 |
| 2004/0164353 A1 * | 8/2004 | Iwamatsu et al. | ........... | 257/351 |
| 2005/0026424 A1 * | 2/2005 | Enomoto et al. | ............ | 438/638 |

(Continued)

FOREIGN PATENT DOCUMENTS

JP 2002-237603 8/2002

*Primary Examiner*—W. David Coleman
*Assistant Examiner*—Maliheh Malek
(74) *Attorney, Agent, or Firm*—Volentine & Whitt, P.L.L.C.

(57) ABSTRACT

A method for fabricating a semiconductor element on a semiconductor substrate having a support substrate and a semiconductor layer above the support substrate. The method includes preparing the semiconductor substrate having a transistor formation region and an element isolation region both defined thereon; forming a pad oxide film on the semiconductor layer of the semiconductor substrate; forming an oxidation-resistant mask layer on the pad oxide film; forming a resist mask to cover the transistor formation region on the oxidation-resistant mask layer; performing a first etching process for etching the oxidation-resistant mask layer using the resist mask as a mask to expose the pad oxide film of the element isolation region; and removing the resist mask and oxidizing the semiconductor layer below the exposed pad oxide film by LOCOS using the exposed oxidation-resistant mask layer as a mask to form an element isolation layer.

8 Claims, 7 Drawing Sheets

U.S. PATENT DOCUMENTS

2005/0079717 A1* 4/2005 Savas et al. .................. 438/689
2005/0142706 A1* 6/2005 Ahn et al. .................... 438/165
2006/0105540 A1* 5/2006 Sakata et al. ................. 438/439

* cited by examiner

METHOD FOR FABRICATING SEMICONDUCTOR ELEMENT

BACKGROUND OF THE INVENTION

1. Field of the Invention

The present invention relates to a method for fabricating a semiconductor element, by which an element isolation layer is formed by LOCOS (Local Oxidation of Silicon) in a semiconductor layer of an SOI (Silicon On Insulator) substrate or an SOS (Silicon On Sapphire) substrate.

2. Description of the Related Art

As is well known in the art, a technique for fabricating a semiconductor device using the SOI substrate or the SOS substrate can facilitate complete isolation between semiconductor elements formed in the semiconductor layer, thereby preventing soft errors or latch-ups. The technique can also reduce the junction capacitance of the source-drain region. Accordingly, the technique serves to realize higher operation speeds and reduced power consumption, and is thus often employed to manufacture semiconductor devices.

In recent years, as increasingly higher density semiconductor devices are demanded, finer design rules are applied to manufacture semiconductor elements mainly using the SOI substrate or the SOS substrate that includes a semiconductor layer of a thickness of 50 nm (nanometer) or less in which a semiconductor element is formed.

On the other hand, the LOCOS technique is available as one of the methods of forming an element isolation layer on a typical silicon substrate to isolate dielectrically between semiconductor elements. This method is also employed to form an element isolation layer in a relatively thick-film silicon layer.

The element isolation layer can be typically formed in such a relatively thick-film silicon layer as follows. That is, before the element isolation layer is formed, a silicon nitride film is formed on the silicon layer via a pad oxide film. These films are then etched by anisotropic etching to expose the silicon layer, and the exposed silicon is oxidized by LOCOS to form an insulating film of silicon dioxide ($SiO_2$).

On the other hand, a thin-film semiconductor layer is etched as follows. That is, to form a sidewall spacer of silicon dioxide on the sidewall of the gate electrode of a MOS element, a 70 to 90% of the thickness of the silicon dioxide film formed on top of the gate electrode is etched. Thereafter, the remaining silicon dioxide film is removed by plasma etching with a high selection ratio against silicon, thereby removing the silicon dioxide film on top of the gate electrode. Thus, formation of tails is prevented which would be otherwise caused by deposition of polymerized film on the sidewall portion of the gate electrode (e.g., Japanese Patent Laid-Open Publication No. 2002-237603 (Page 5, Paragraph 0031 to Paragraph 0036, and FIG. 6.)

Furthermore, the applicant has suggested a technique in Japanese Patent Application No. 2004-332695 as a method of forming an element isolation layer in a thin-film semiconductor layer. In this method, a silicon nitride film that has been formed on a semiconductor layer via a pad oxide film is etched, but not completely, in the first etching process with a high etching rate for the silicon nitride film. Thereafter, in the second etching process with a high selection ratio against silicon, the semiconductor layer is exposed, and then the element isolation layer is formed in the exposed semiconductor layer by LOCOS.

The aforementioned typical method of fabricating the element isolation layer causes degradation in reliability of the semiconductor device because of the following reasons. That is, the semiconductor layer reduced in thickness down to 50 nm or less due to finer design rules for the semiconductor device would increase the risk of removing the semiconductor layer when part of the silicon nitride film (an oxidation-resistant mask layer) that has been deposited before the element isolation layer is formed is etched by anisotropic etching. Thus, when the semiconductor layer is not left but removed, it is difficult to form an insulating film of silicon dioxide by LOCOS, thereby causing incomplete dielectric isolation between semiconductor elements and thus leading to short circuits between the adjacent semiconductor elements.

On the other hand, even when the semiconductor layer is left, the remaining semiconductor layer is thinner than the semiconductor layer below the silicon nitride film that has been left as a mask. This may cause a side of the semiconductor layer below the silicon nitride film left as the mask to be exposed, and thus the side would be directly oxidized. As a result, a bird's beak would be readily formed, resulting in an effective transistor formation region being reduced.

SUMMARY OF THE INVENTION

The present invention was developed to solve the aforementioned problems. It is therefore an object of the invention to provide means which enables formation of an element isolation layer in a semiconductor layer with stability and prevents formation of bird's beaks.

The present invention provides a method for fabricating a semiconductor element on a semiconductor substrate having a support substrate and a semiconductor layer above the support substrate. The method comprises the steps of: preparing the semiconductor substrate having a transistor formation region and an element isolation region both defined thereon; forming a pad oxide film on the semiconductor layer of the semiconductor substrate; forming an oxidation-resistant mask layer on the pad oxide film; forming a resist mask to cover the transistor formation region on the oxidation-resistant mask layer; performing a first etching process for etching the oxidation-resistant mask layer using the resist mask as a mask to expose the pad oxide film of the element isolation region; and removing the resist mask and oxidizing the semiconductor layer below the exposed pad oxide film by LOCOS using the exposed oxidation-resistant mask layer as a mask to form an element isolation layer.

It is thus made possible to allow the thin silicon layer below the pad oxide film to remain unchanged in thickness and ensures a sufficient thickness of the silicon layer required for oxidation by LOCOS to form the element isolation layer with stability. It is also possible to prevent the side of the thin silicon layer from being directly oxidized, thereby preventing formation of bird's beaks.

DETAILED DESCRIPTION OF THE INVENTION

Now, a description will be given to a method for fabricating a semiconductor element according to an embodiment of the present invention with reference to the accompanying drawings.

Figure 7:
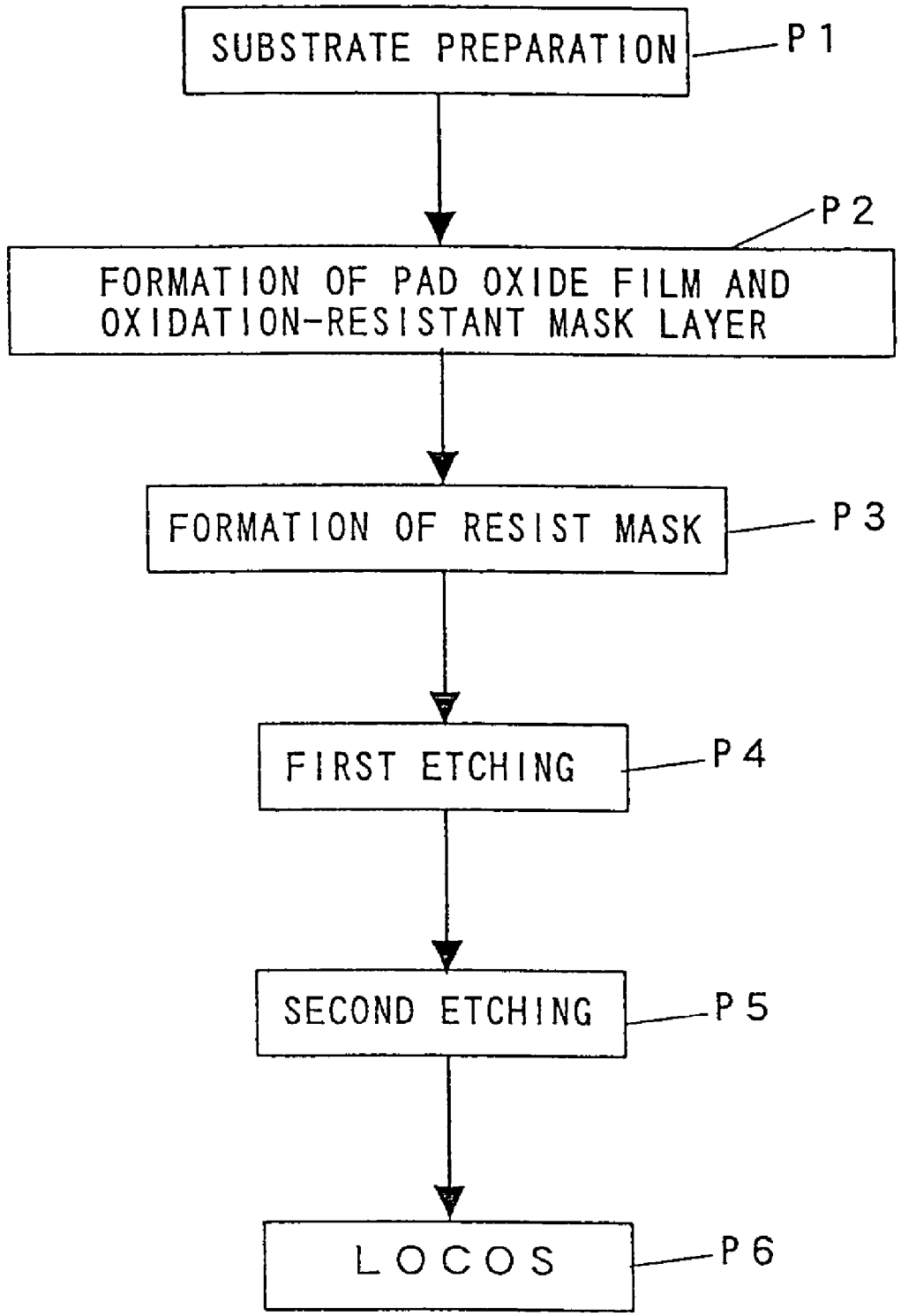
FIGS. 7 and 8 are explanatory flowcharts illustrating processes for fabricating the element isolation layer according to the embodiment and another embodiment.
Figure 8:
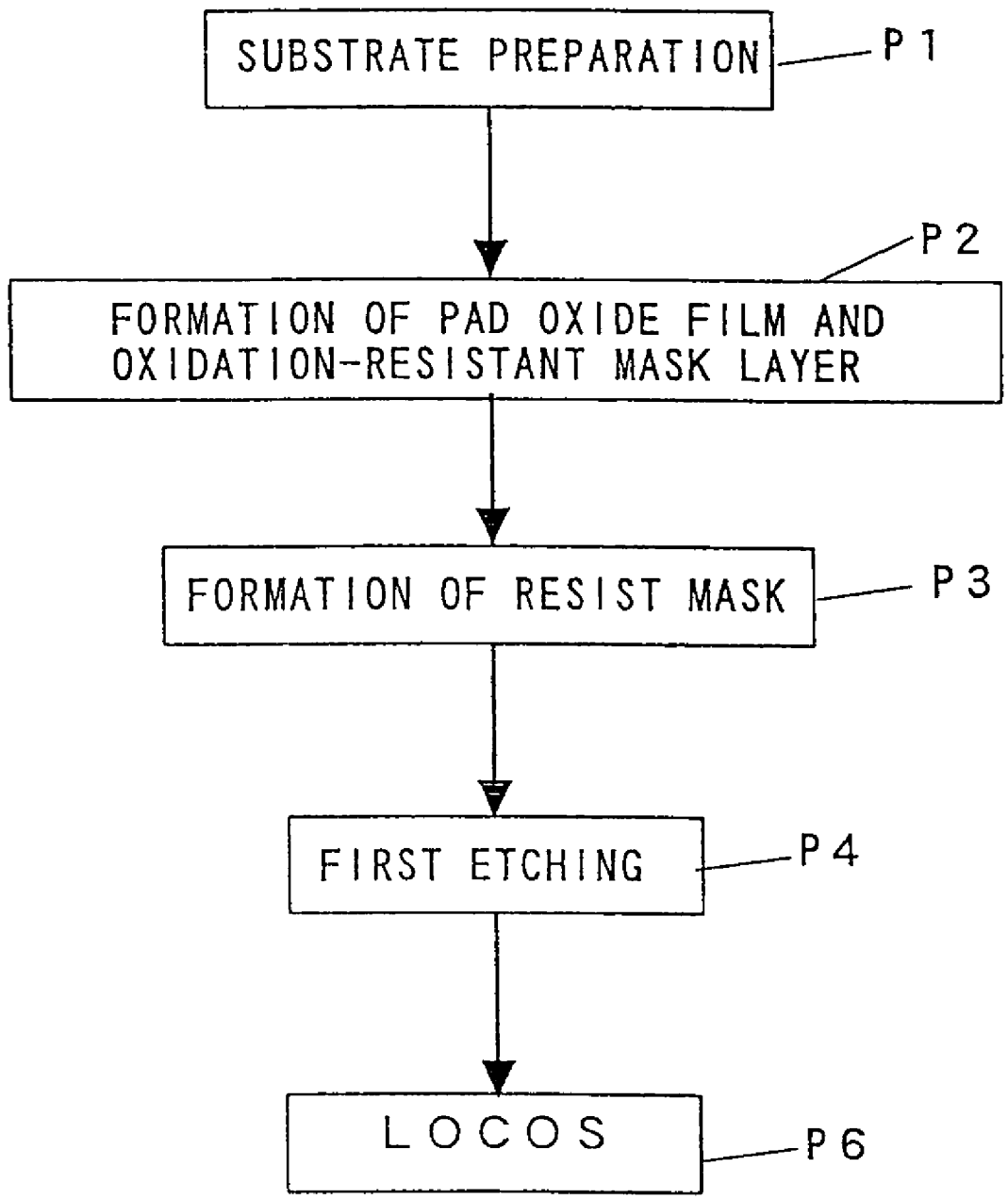

FIGS. 1 through 6 are explanatory views illustrating processes for fabricating an element isolation layer according to the present embodiment. FIGS. 7 and 8 are explanatory flowcharts illustrating processes for fabricating the element isolation layer according to the embodiment and another embodiment.

As described below, this embodiment employs an SOI substrate by way of example.

Referring to FIGS. 1 through 6, a semiconductor substrate or an SOI substrate 1 is formed, in which included in layers are a silicon substrate 2 serving as a support substrate, an insulating layer 3 of silicon dioxide formed on the silicon substrate 2, and a thin silicon layer 4 serving as a thin semiconductor layer of monocrystalline silicon.

Figure 1:
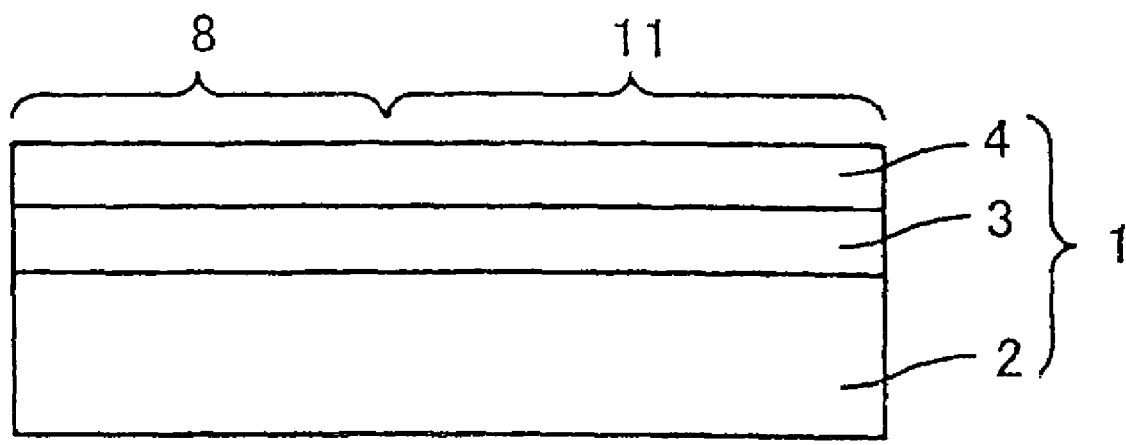
FIGS. 1-6 are explanatory views each illustrating processes for fabricating an element isolation layer according to an embodiment.
Figure 2:
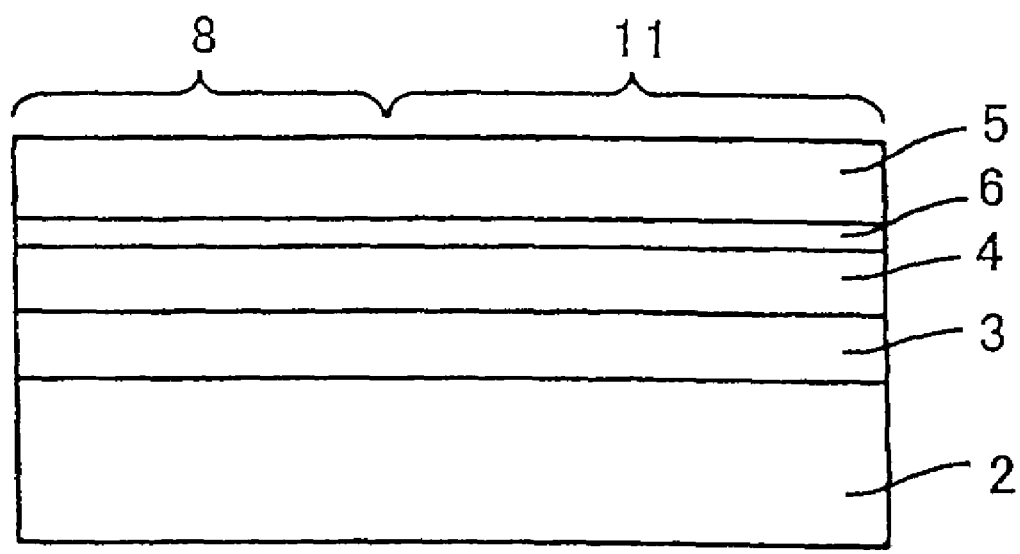

A silicon nitride film 5 serving as an oxidation-resistant mask layer is formed by CVD (Chemical Vapor Deposition) on a pad oxide film 6, or a thin silicon dioxide film, which is formed on the thin silicon layer 4 by thermal oxidation as shown in FIG. 2. The silicon nitride film 5 functions as a mask in forming an element isolation layer 10 by LOCOS as discussed later.

Note that one of the typical roles the pad oxide film 6 plays is to alleviate stress caused by the difference in lattice constant of the crystalline structure between the silicon nitride film 5 and the thin silicon layer 4 of moncrystalline silicon.

Figure 3:
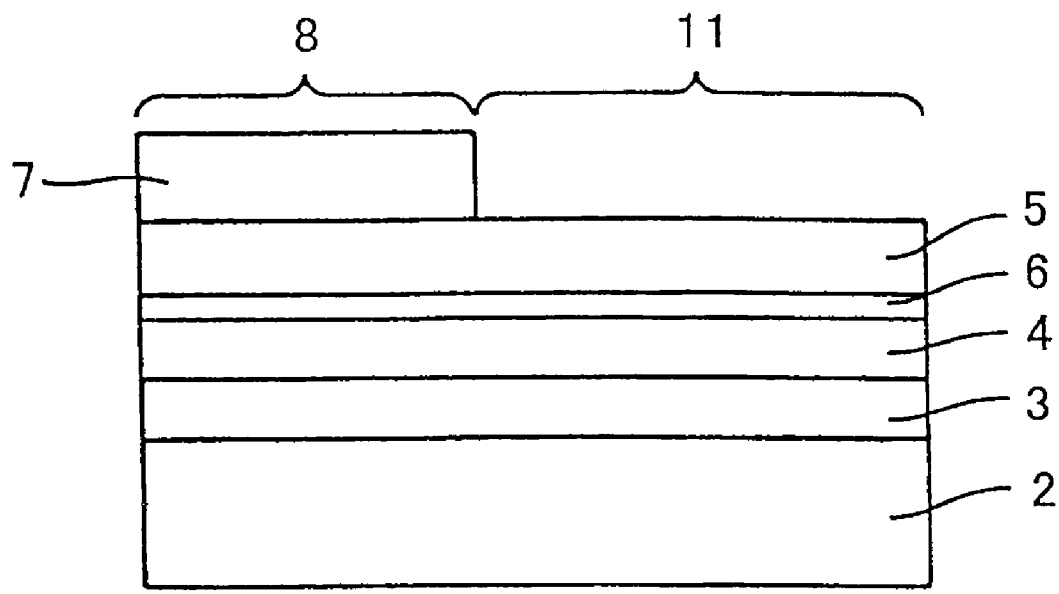

A resist mask 7 is formed by exposing, by means of lithography, the photoresist with which the silicon nitride film 5 is coated and then developing the photoresist as shown in FIG. 3. At the time of etching, the resist mask 7 serves as a mask member for covering a region on the surface of the thin silicon layer 4 in which semiconductor elements are formed (hereinafter referred to as a transistor formation region 8).

Figure 4:
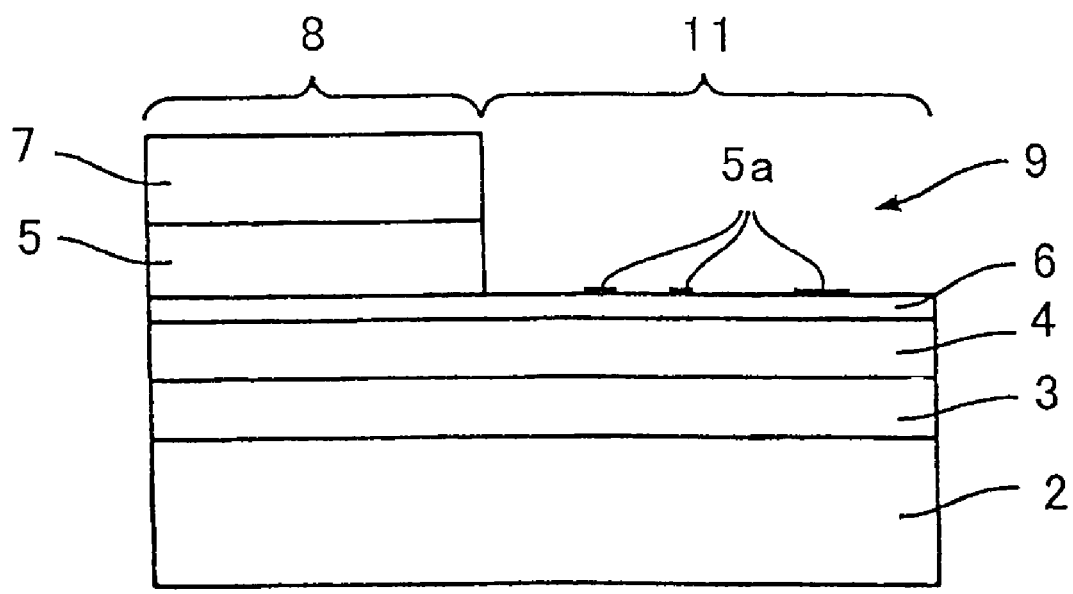

A removed portion 9 is a portion which has been etched away by anisotropic etching, as shown in FIG. 4.

Figure 5:
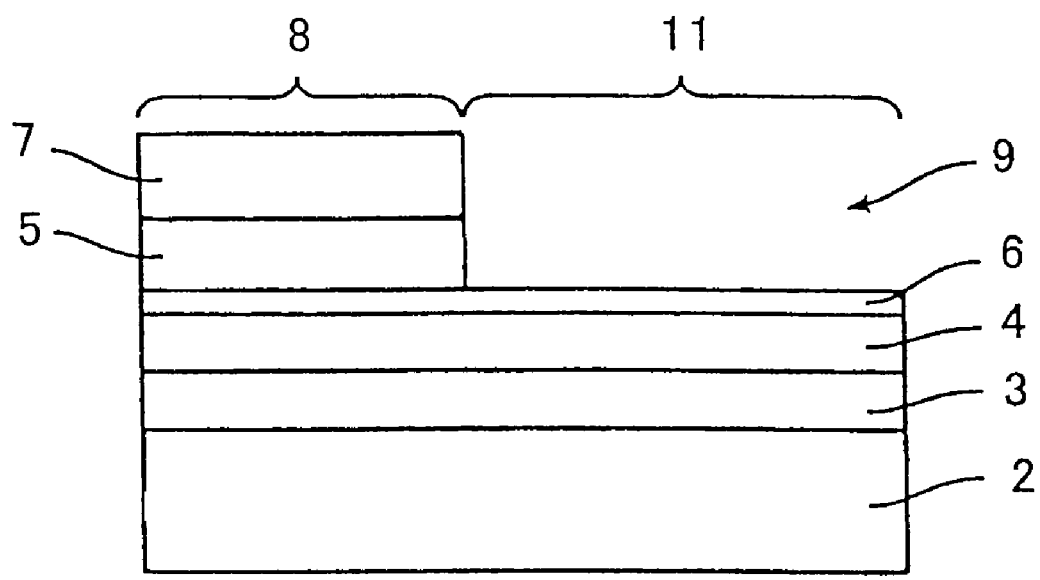
Figure 6:
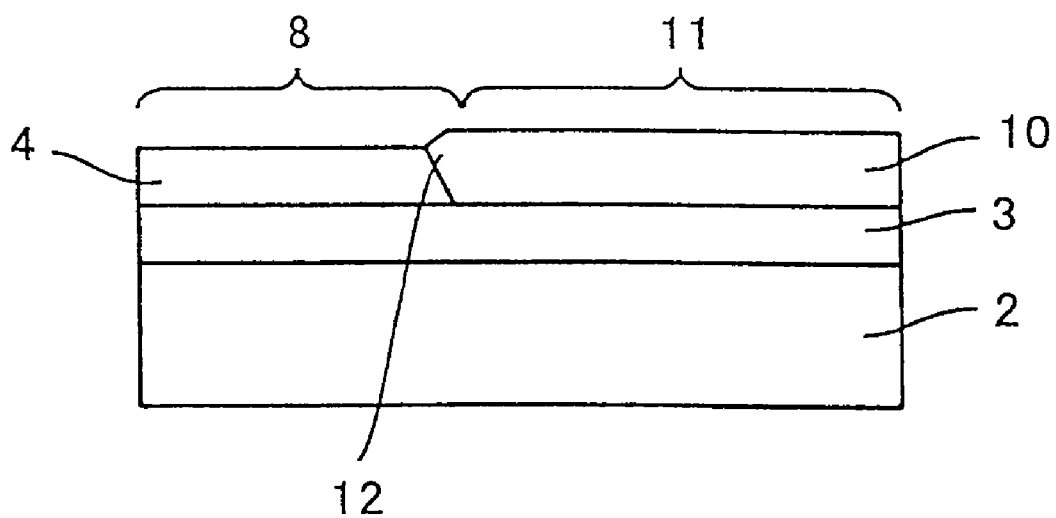

An element isolation layer 10 shown in FIG. 6 is a thick insulating film of silicon dioxide, which is formed by oxidizing the thin silicon layer 4 or the like shown in FIG. 5 by LOCOS at an element isolation region 11 on the surface of the thin silicon layer 4, and functions to isolate dielectrically between transistor formation regions 8 on the thin silicon layer 4.

A bird's beak 12 is formed of the silicon dioxide which has grown towards the transistor formation region 8 from the element isolation region 11 when the thin silicon layer 4 is oxidized by LOCOS.

Now, referring to FIGS. 1 through 8, a description will be given to the processes, indicated by P's, for fabricating the element isolation layer of this embodiment.

In process P1 (FIG. 1), the insulating layer 3 and the thin silicon layer 4 are deposited on the silicon substrate 2 to prepare the SOI substrate 1 which has the transistor formation region 8 and the element isolation region 11 both defined thereon. The thickness of the thin silicon layer 4 is, e.g., 350 angstroms.

In process P2 (FIG. 2), the pad oxide film 6 of a small thickness is formed by thermal oxidation on the thin silicon layer 4 that is disposed above the silicon substrate 2 of the prepared SOI substrate 1, and then the silicon nitride film 5 is formed by CVD on the pad oxide film 6. The thickness of the pad oxide film 6 is, e.g., 70 angstroms, while the thickness of the silicon nitride film 5 is, e.g., 1000 angstroms.

In process P3 (FIG. 3), the resist mask 7 is formed on the silicon nitride film 5 by lithography to cover the transistor formation region 8.

In process P4 (FIG. 4), with the resist mask 7 formed in process P3 being employed as a mask, an etching apparatus, e.g., an ICP-type plasma etcher is used to perform anisotropic etching to etch away the silicon nitride film 5 and thereby form the removed portion 9 in which the pad oxide film 6 is exposed (the first etching process). The anisotropic etching is performed with a selection ratio against oxidized film of 3.2 (or an etching rate ratio between the etched film (the silicon nitride film 5 in this embodiment) and the oxidized film (the pad oxide film 6 in this embodiment)). The anisotropic etching is carried out under the first etching conditions such as a gas mixture of working gases $CF_4$ and $HBr$ ($CF_4/HBr=70/30$ sccm), a pressure of 50 mTorr, a RF (Radio Frequency) power of 600 W, and a biasing RF power of 20 W to be applied to the cathode electrode for controlling ion energy.

In this case, to ensure that the pad oxide film 6 remains, the selection ratio against oxidized film is preferably 2.5 or greater.

Figure 9:
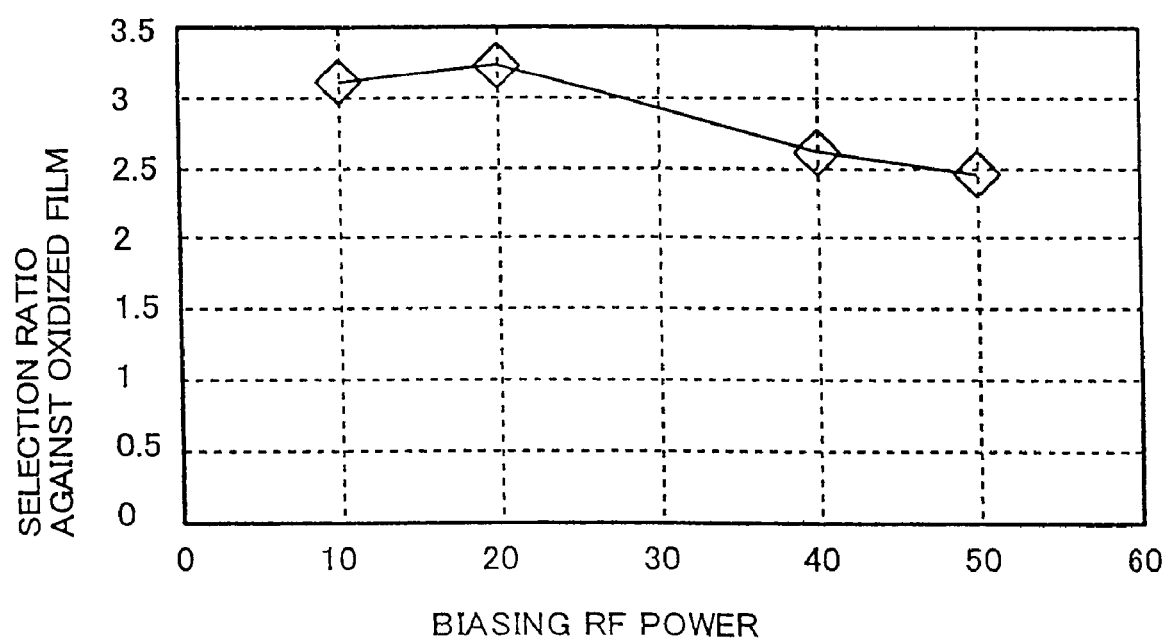
FIG. 9 is a graph showing a dependency of a selection ratio against oxidized film on RF power according to the embodiment.

Additionally, an experiment was carried out with only the biasing RF power changed among the first etching conditions set by the inventor. The experiment shows that the selection ratio against oxidized film is affected by the biasing RF power, and thus the biasing RF power should be set within the range of 10 W or more and less than 40 W to provide a selection ratio against oxidized film of 2.5 or greater as shown in FIG. 9.

Note that a biasing RF power less than 10 W would cause the etching rate for the silicon nitride film 5 to be extremely decreased and the time required for etching the silicon nitride film 5 of a relatively thick film to be elongated, and is thus inappropriate as an etching condition for the first etching process.

The aforementioned first etching process is intended to remove completely the silicon nitride film 5 on the pad oxide film 6 in all the element isolation regions 11 that are defined on the SOI substrate 1, so that no defects will be caused in the element isolation layer 10 to be subsequently formed.

Accordingly, if the silicon nitride film 5 in all the element isolation regions 11 is completely removed in the first etching process, the subsequent second etching process is not needed. Thus, the second etching process may be omitted in another method for fabricating a semiconductor element, as shown in the flowchart of FIG. 8. However, in practice, a partially uneven distribution of plasma or the like according to the first etching conditions may cause the silicon nitride film 5 of the element isolation region 11 to be incompletely removed in some cases. Thus, after the first etching process, a residue 5a of the silicon nitride film 5 may be locally found on the pad oxide film 6.

In this case, a step of inspecting the residue 5a of the silicon nitride film 5 may be carried out after the first etching process, so that the second etching process is eliminated depending on the result of the inspection. However, the cycle time of the fabrication process may be disorganized by omission of the second etching process.

Accordingly, regardless of the presence of a residue 5a of the silicon nitride film 5 on the pad oxide film 6, the second etching process is to be performed to ensure that the pad oxide film 6 in the element isolation region 11 is exposed in a clean condition.

In process P5 (FIG. 5), with the resist mask 7 formed in process P3 being employed as a mask as it is, the etching apparatus is used to perform anisotropic etching to etch away the residue 5a of the silicon nitride film 5 and thus expose the pad oxide film 6 of the element isolation region 11 (the second etching process). The anisotropic etching is performed with a selection ratio against oxidized film of about 15. The anisotropic etching is based on the second etching conditions such as a gas mixture of working gases of a $SF_6$ gas, which replaces the $CF_4$ gas in the first etching conditions, and an additional He gas ($SF_6$/HBr/He =25/75/50 sccm), a pressure of 40 mTorr, an RF power of 700 W, and a biasing RF power of 0 W.

In this case, the biasing RF power is set to 0 W to remove the residue 5a of the silicon nitride film 5 with reliability and allow the pad oxide film 6 to be left by making the selection ratio against oxidized film higher than in the first etching process, thereby slowing the etching rate of the pad oxide film 6.

Figure 10:
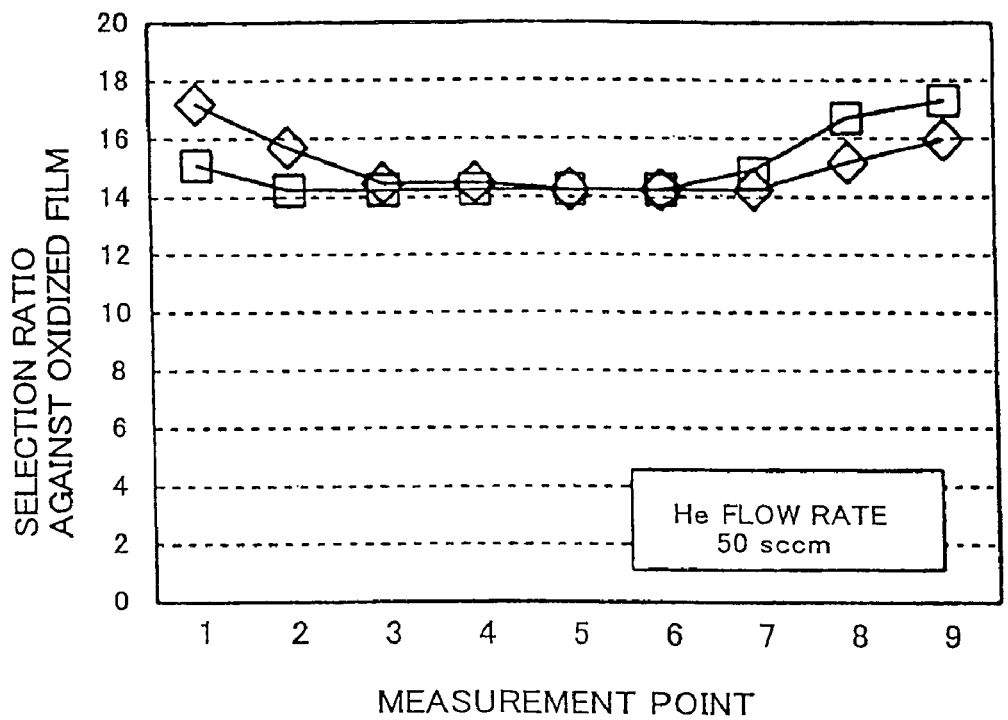
FIGS. 10 and 11 are graphs showing the dependence of a selection ratio against oxidized film on a He flow rate according to the embodiment.

On the other hand, with the He gas additionally employed to create plasma in a stable condition, an experiment was carried out with only the He flow rate changed among the second etching conditions set by the inventor. In this case, the experiment shows that the selection ratio against oxidized film is affected by the He flow rate, and thus the He flow rate should be set at 50 sccm to provide a selection ratio against oxidized film of about 15 in all the element isolation regions 11 of the SOI substrate 1, as shown in FIG. 10. It is also shown that an increase in He flow rate up to 100 sccm causes the selection ratio against oxidized film to be reduced down to about 8, as shown in FIG. 11.

Figure 11:
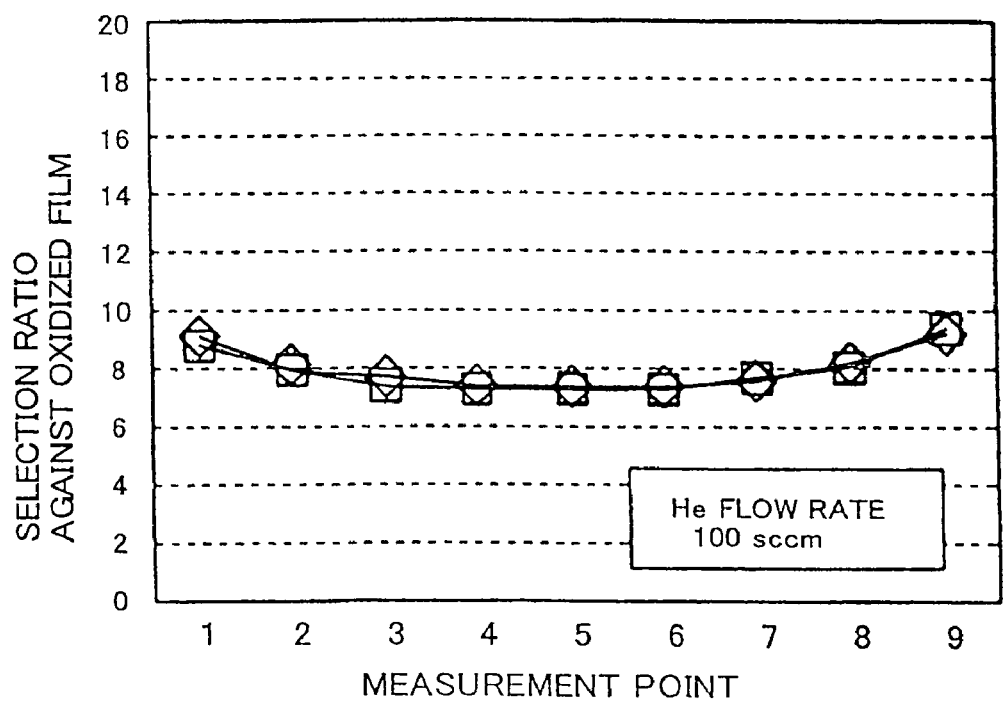

Note that each horizontal axis of FIGS. 10 and 11 represents measurement points defined on the element isolation region 11 on the SOI substrate 1. The results of this experiment were obtained from measurements at nine points defined on a plurality of element isolation regions 11 of the SOI substrate 1. That is, with the orientation flat of the wafer placed down, the nine points spaced equidistantly on a horizontal line including the central point of the wafer were defined and sequentially numbered from the left within the wafer for measurement, and indicated on the horizontal axis of FIGS. 10 and 11. Accordingly, "5" on the horizontal axis of FIGS. 10 and 11 corresponds to the central point of the wafer.

In process P6 (FIG. 6), the resist mask 7 is removed. Then, with the exposed silicon nitride film 5 employed as a mask, the thin silicon layer 4 that is located below the pad oxide film 6 exposed in the aforementioned etching process is oxidized by LOCOS in a wet environment. This causes the thin silicon layer 4 below the pad oxide film 6 to be oxidized via the pad oxide film 6, thereby forming the element isolation layer 10 in a thickness of 2000 angstroms.

In this case, not as is in the conventional art, the thin silicon layer 4 is covered with the pad oxide film 6, and thus it would not happen that the side of the thin silicon layer 4 below the silicon nitride film 5 left as a mask is exposed and directly oxidized. This allows for preventing the bird's beak 12 from being formed.

Furthermore, since the thin silicon layer 4 below the pad oxide film 6 is not etched at all but remains unchanged in thickness, it is possible to provide a sufficient thickness of the silicon layer required for the oxidation by LOCOS, thus allowing a thick element isolation layer 10 to be formed quickly with stability.

Thereafter, by wet etching using thermal phosphoric acid and hydrofluoric acid, the silicon nitride film 5 and the pad oxide film 6 are etched away.

As such, the transistor formation region 8 surrounded by the element isolation layer 10 is formed in the thin silicon layer 4 on the SOI substrate 1, so that a semiconductor element is to be formed in the transistor formation region 8.

As described above, this embodiment is adapted such that the pad oxide film and the silicon nitride film are formed on the thin silicon layer by deposition, the silicon nitride film is then etched away under the first etching conditions, and the exposed pad oxide film is oxidized by LOCOS to form the element isolation layer. This allows the thin silicon layer below the pad oxide film to remain unchanged in thickness and ensures a sufficient thickness of the silicon layer required for oxidation by LOCOS to form the element isolation layer with stability. It is thus possible to provide perfect dielectric isolation between semiconductor elements and thus improve the reliability of the semiconductor device. It is also possible to prevent direct oxidation of the side of the thin silicon layer and formation of bird's beaks, thereby providing an extended effective transistor formation region.

Additionally, the silicon nitride film is removed in the first etching process, and then in the second etching process, a remaining residue of the silicon nitride film is removed under the second etching conditions with a high selection ratio against oxidized film. This ensures that the pad oxide film of the element isolation region is exposed in a clean condition, and defects are prevented in the element isolation layer, thereby making it possible to provide further improved reliability to the semiconductor device.

Furthermore, the first etching conditions include the use of a gas mixture of a $CF_4$ gas and a HBr gas and a biasing RF power of 10 W or more and less than 40 W. This ensures that the pad oxide film is left while the etching rate of the silicon nitride film is accelerated with a selection ratio against oxidized film of 2.5 or greater. The element isolation layer is thus formed with stability.

Furthermore, the second etching conditions include a gas mixture of a $SF_6$ gas, which replaces the $CF_4$ gas in the first etching conditions, and a biasing RF power of 0 W. This ensures that the residue 5a of the silicon nitride film 5 is removed. It is also ensured that the pad oxide film is left over by making the selection ratio against oxidized film higher than in the first etching process to decrease the etching rate for the pad oxide film 6.

In the embodiment described above, the silicon nitride film is removed and then the pad oxide film is oxidized by LOCOS to form the element isolation layer. However, it is also possible that the silicon nitride film is removed, the pad oxide film is then removed to expose the thin silicon layer by wet etching without any reduction in the thickness of the thin silicon layer, and thereafter, the thin silicon layer is oxidized by LOCOS to form the element isolation layer. This can also prevent the side of the thin silicon layer 4 below the silicon nitride film 5 that is left as a mask from being exposed and thereby directly oxidized. It is thus possible to suppress the formation of a bird's beak and provide a stable element isolation layer.

In this case, the wet etching for removing the pad oxide film without any reduction in the thickness of the thin silicon layer can be realized by the wet etching using such as thermal phosphoric acid and hydrofluoric acid.

Furthermore, in the embodiment described above, the semiconductor substrate is an SOI substrate. However, the semiconductor substrate is not limited to the SOI substrate. It is also possible to employ an SOS substrate in which a thin silicon layer of monocrystalline silicon is formed by deposition as a semiconductor layer on a sapphire substrate serving as a support substrate.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2005-188521 which is hereby incorporated by reference.

What is claimed is:

1. A method for fabricating a semiconductor element on a semiconductor substrate having a support substrate and a semiconductor layer above said support substrate, the method comprising:

preparing said semiconductor substrate having a transistor formation region and an element isolation region both defined thereon;

forming a pad oxide film on the semiconductor layer of said semiconductor substrate;

forming an oxidation-resistant mask layer on said pad oxide film;

forming a resist mask on said oxidation-resistant mask layer to cover said transistor formation region;

performing a first etching process for etching said oxidation-resistant mask layer using said resist mask as a mask to expose the pad oxide film of said element isolation region;

performing a second etching process for etching, using said resist mask, with a selection ratio against an oxidized film that is higher than a selection ratio against the oxidized film in said first etching process, to remove a residue of said oxidation-resistant mask layer left on the pad oxide film exposed after said first etching process;

removing said resist mask to expose said oxidation-resistant mask layer over said transistor formation region; and oxidizing said semiconductor layer below the pad oxide film by LOCOS using said exposed oxidation-resistant mask layer as a mask to form an element isolation layer, wherein the etching in said first etching process is anisotropic etching with a gas mixture of a $CF_4$ gas and a HBr gas, and a biasing RF power of 10 W or more and less than 40 W to control ion energy to be applied to a cathode electrode, and the etching in said second etching process is anisotropic etching with a $SF_6$ gas replacing the $CF_4$ gas and a biasing RF power of 0 W.

2. The method for fabricating a semiconductor element according to claim 1, wherein said pad oxide film is a thin silicon dioxide film.

3. The method for fabricating a semiconductor element according to claim 1, wherein said oxidation-resistant mask layer is a silicon nitride film.

4. The method for fabricating a semiconductor element according to claim 1, wherein a selection ratio of etching rates between said oxidation-resistant mask layer and said pad oxide film is preferably 2.5 or greater.

5. The method for fabricating a semiconductor element according to claim 1, further comprising a wet etching process after said removing said resist mask.

6. The method for fabricating a semiconductor element according to claim 1, wherein said semiconductor layer is a thin silicon film.

7. The method for fabricating a semiconductor element according to claim 1, wherein said semiconductor substrate is a Silicon On Insulator substrate.

8. The method for fabricating a semiconductor element according to claim 1, wherein said semiconductor substrate is a Silicon On Sapphire substrate.

* * * * *